(12) United States Patent
Gotkis et al.

(10) Patent No.: US 6,767,428 B1
(45) Date of Patent: Jul. 27, 2004

(54) METHOD AND APPARATUS FOR CHEMICAL MECHANICAL PLANARIZATION

(75) Inventors: Yehiel Gotkis, Fremont, CA (US); Aleksandar Owczarz, San Jose, CA (US); Rod Kistler, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 68 days.

(21) Appl. No.: 10/029,192
(22) Filed: Dec. 20, 2001
(51) Int. Cl.[7] .................................................. C23F 1/02
(52) U.S. Cl. .................... 156/345.12; 451/268; 451/66; 451/72
(58) Field of Search ................... 156/345.12, 345.14, 156/345.13; 451/66, 72, 268

(56) References Cited

U.S. PATENT DOCUMENTS 6,358,118 B1 * 3/2002 Boehm et al. ............... 451/24
6,475,332 B1 * 11/2002 Boyd et al. ............ 156/345.12
6,579,157 B1 * 6/2003 Gotkis et al. ................. 451/56

* cited by examiner

*Primary Examiner*—P. Hassanzadeh
*Assistant Examiner*—Sylvia R. MacArthur
(74) *Attorney, Agent, or Firm*—Martine & Penilla, LLP

(57) ABSTRACT

An invention is provided for a chemical mechanical planarization apparatus. The apparatus includes a cylindrical frame, a polishing membrane attached to an end of the cylindrical frame, and a pad support disposed within the cylindrical frame and below the polishing membrane that is capable of differentially flexing the polishing membrane. The pad support can be air bearing that provides air pressure to the polishing membrane to differentially flex the polishing membrane during a CMP process. In a further aspect, the pad support can be in contact with the polishing membrane, and include mechanical elements that are capable of differentially flexing the polishing membrane during a CMP process. In addition, the apparatus can include a conditioner element disposed above the polishing membrane, and a conditioner pad support disposed below the polishing membrane and the conditioner element, wherein the conditioner element is capable of eroding the polishing membrane.

13 Claims, 10 Drawing Sheets

METHOD AND APPARATUS FOR CHEMICAL MECHANICAL PLANARIZATION

BACKGROUND OF THE INVENTION

1. Field of the Invention

This invention relates generally to chemical mechanical planarization apparatuses, and more particularly to methods and apparatuses for improved uniformity in chemical mechanical planarization applications via a membrane based chemical mechanical planarization apparatus.

2. Description of the Related Art

In the fabrication of semiconductor devices, planarization operations, which can include polishing, buffing, and wafer cleaning, are often performed. Typically, integrated circuit devices are in the form of multi-level structures. At the substrate level, transistor devices having diffusion regions are formed. In subsequent levels, interconnect metallization lines are patterned and electrically connected to the transistor devices to define the desired functional device. Patterned conductive layers are insulated from other conductive layers by dielectric materials, such as silicon dioxide. As more metallization levels and associated dielectric layers are formed, the need to planarize the dielectric material increases. Without planarization, fabrication of additional metallization layers becomes substantially more difficult due to the higher variations in the surface topography. In other applications, metallization line patterns are formed in the dielectric material, and then metal planarization operations are performed to remove excess metallization. Further applications include planarization of dielectric films deposited prior to the metallization process, such as dielectrics used for shallow trench isolation or for poly-metal insulation. One method for achieving semiconductor wafer planarization is the chemical mechanical planarization (CMP) process.

In general, the CMP process involves holding and rubbing a typically rotating wafer against a moving polishing pad under a controlled pressure and relative speed. CMP systems typically implement orbital, belt, or brush stations in which pads or brushes are used to scrub, buff, and polish one or both sides of a wafer. Slurry is used to facilitate and enhance the CMP operation. Slurry is most usually introduced onto a moving preparation surface and distributed over the preparation surface as well as the surface of the semiconductor wafer being buffed, polished, or otherwise prepared by the CMP process. The distribution is generally accomplished by a combination of the movement of the preparation surface, the movement of the semiconductor wafer and the friction created between the semiconductor wafer and the preparation surface.

FIG. 1A is a diagram showing a conventional table based CMP apparatus 50. The conventional table based CMP apparatus 50 includes a polishing head 52, which holds a wafer 54, and is attached to a translation arm 64. In addition, the table based CMP apparatus 50 includes a polishing pad 56 that is disposed above a polishing table 58, which is often referred to as a polishing platen.

In operation, the polishing head 52 applies downward force to the wafer 54, which contacts the polishing pad 56. Reactive force is provided by the polishing table 58, which resists the downward force applied by the polishing head 52. The polishing pad 56 is used in conjunction with slurry to polish the wafer 54. Typically, the polishing pad 56 comprises foamed polyurethane or a sheet of polyurethane having a grooved surface. The polishing pad 56 is wetted with a polishing slurry having both an abrasive and other polishing chemicals. In addition, the polishing table 58 is rotated about its central axis 60, and the polishing head 52 is rotated about its central axis 62. Further, the polishing head can be translated across the polishing pad 56 surface using the translation arm 64. In addition to the table based CMP apparatus 50 discussed above, linear CMP systems have been conventionally used to perform CMP.

FIG. 1B shows a side view of a conventional linear wafer polishing apparatus 100. The linear wafer polishing apparatus 100 includes a polishing head 108, which secures and holds a wafer 104 in place during processing. A polishing pad 102 forms a continuous loop around rotating drums 112, and generally moves in a direction 106 at a speed of about 400 feet per minute, however this speed may vary depending upon the specific CMP operation. As the polishing pad 102 moves, the polishing head 108 rotates and lowers the wafer 104 onto the top surface of the polishing pad 102.

A platen manifold assembly 110 supports the polishing pad 102 during the polishing process. The platen manifold assembly 110 may utilize any type of bearing such as a fluid bearing or a gas bearing. The platen manifold assembly 110 is supported and held into place by a platen surround plate 116. Gas pressure from a gas source 114 is inputted through the platen manifold assembly 110 via a plurality of independently controlled of output holes that provide upward force on the polishing pad 102 to control the polishing pad profile.

Unfortunately, in each of the above CMP systems non-uniformities in material removal rate and process instability can occur. Generally, uniformity requires all parameters defining the material removal rate to be evenly distributed across the entire contact surface that interfaces with the wafer. In addition, process stability generally requires the properties of the contacting surface to remain essentially constant.

Edge instabilities in CMP are among the most significant performance affecting issues and among the most complicated problems to resolve. FIG. 2 is a diagram showing a wafer pad interface 200, illustrating edge effect non-uniformity factors. As shown in FIG. 2, when the wafer 54 contacts the polishing pad 56 during the CMP process, the flexibility in the polishing pad 56 allows the wafer 54 to form a depression in the polishing pad 56. More particularly, although the polishing pad 56 is a compressible medium, the polishing pad 56 has limited flexibility, which prevents the polishing pad 56 from conforming to the exact shape of the wafer 54, forming transient deformation zones. As a result, edge effects occur at the wafer edge 202 from a non-flat contact field resulting from redistributed contact forces. Hence, large variations in removal rates occur at the wafer edge 202.

Process instability is another problem occurring in prior art CMP systems. Efficient CMP systems allow the use of a given set of consumables for processing of a significant number of wafers, at least several hundred, before the consumables require replacement. Unfortunately, prior art CMP systems inject process instabilities into the CMP process through wear on the polishing surface, as illustrated in FIGS. 3A and 3B.

FIG. 3A is a diagram showing a top view of a prior art table based CMP apparatus 300. As shown in FIG. 3A, when a wafer 54 undergoes planarization using the polishing pad 56, material is eroded from the polishing pad 56 in addition to the material removed from the surface of the wafer 54. Pad material is removed from the polishing pad 56 in a wafer path that contacts the wafer 54 during the CMP process. Moreover, the pad erosion rate is distributed non-evenly, being higher at the central path 304, less near the edge sections 304a of the wafer path, and remaining non-eroded in outer pad regions 302 that are outside the wafer path. As similar behavior occurs on a linear apparatus, as shown in FIG. 3B.

FIG. 3B is a diagram showing a top view of a prior art linear wafer polishing apparatus 350. As shown in FIG. 3B, when a wafer 104 undergoes planarization using the polishing pad 102, material is eroded from the polishing pad 102 in addition to the material removed from the surface of the wafer 104. As above, material is removed from the polishing pad 102 in a wafer path 352 that contacts the wafer 104 during the CMP process. As with table based CMP apparatus 300, the pad erosion rate is distributed non-evenly. The pad erosion rate is higher at the central path 354, less near the edge sections 354a of the wafer path, and remaining non-eroded in outer pad regions 352 that are outside the wafer path.

The variation in the pad material erosion causes the polishing pad to loosen contact with the wafer surface during the CMP process, as shown in FIG. 4. FIG. 4 is a diagram showing a wafer pad interface 400, illustrating pad erosion related instability factors. As mentioned above, material is eroded from the polishing pad in the wafer path and not from outside the wafer path, and more material is eroded from the central path 304 than from the edge sections 304a of the wafer path. As a result, the polishing pad 56 non-evenly loosens its contact with the wafer 54. This loss of contact with the wafer 54 produces not only non-uniformity, but also produces constantly variable non-uniformity depending on the number of wafers processed, which is instability.

Although the air bearing platen approached utilized in a linear wafer polishing apparatus can compensate for the above mentioned non-uniformity and instability in the CMP process, the belt shape of the polishing pad requires complicated manufacturing procedures, which greatly increase the cost. The special manufacturing requirements of the linear wafer polishing belt discourage CMP pad manufactures from actively producing such polishing belts. As a result, linear polishing belts typically have poor quality and reproducibility, which can discourage integrated circuit (IC) manufactures from utilizing the linear wafer polishing systems even though the linear wafer polishing systems may be very well suited for IC fabrication and work well for future technology needs.

In view of the foregoing, there is a need for CMP systems capable of compensating for process instability and non-uniformity. The CMP systems should be capable of compensating for edge effect and other process instability, and should utilize system elements that do not require highly specialized manufacturing equipment.

SUMMARY OF THE INVENTION

Broadly speaking, the present invention fills these needs by providing a membrane based CMP apparatus that utilizes a flexible polishing surface and a pad support capable of manipulating the polishing surface shape to compensate for process instability and non-uniformity. In addition, embodiments of the present invention can utilize a conventional pad shape, thus allowing conventional process consumables to be utilized.

In one embodiment, an apparatus for CMP is disclosed. The apparatus includes at least one frame, a polishing membrane attached to the frame, and a pad support disposed below the polishing membrane that is capable of differentially flexing the polishing membrane. The frame can have an essentially round shape, thus allowing a conventional pad shape to be utilized for the polishing membrane. In one aspect, the pad support can provide non-contact reactive force to the polishing pad during a CMP process. For example, the pad support can be an air bearing that provides air pressure to the polishing membrane, or a fluid bearing that provides fluid pressure to the polishing membrane. In a further aspect, the pad support can be in contact with the polishing membrane during CMP. For example, the pad support can include mechanical elements capable of differentially flexing the polishing membrane during a CMP process. Further embodiments of the present invention can include a conditioner element disposed above the polishing membrane, wherein the conditioner element is capable of eroding the polishing membrane. In this embodiment, a conditioner pad support can be included that is disposed below the polishing membrane and the conditioner element.

A method for planarizing a wafer surface during a CMP process is disclosed in a further embodiment of the present invention. A pad support is positioned below the polishing membrane, which is attached to at least one frame. The frame is rotated and downward force is applied to a wafer disposed above the polishing membrane and the pad support. The pad support differentially flexes the polishing membrane while providing reactive force to the polishing pad during a CMP process. As mentioned above, the frame can have an essentially round shape, such as a cylindrical shape. Further, the pad support can be air bearing that provides air pressure to the polishing membrane. As above, the pad support can also include mechanical elements that are in contact with the polishing membrane and capable of differentially flexing the polishing membrane during a CMP process. In addition, the polishing membrane can be eroded during the CMP process using a conditioner element.

A further apparatus for CMP is disclosed in a further embodiment of the present invention. The apparatus includes a cylindrical frame, a polishing membrane attached to an end of the cylindrical frame, and a pad support disposed within the cylindrical frame and below the polishing membrane that is capable of differentially flexing the polishing membrane. As above, the pad support can be air bearing that provides air pressure to the polishing membrane to differentially flex the polishing membrane during a CMP process. In a further aspect, the pad support can be in contact with the polishing membrane, and include mechanical elements that are capable of differentially flexing the polishing membrane during a CMP process. In addition, the apparatus can include a conditioner element disposed above the polishing membrane, and a conditioner pad support disposed below the polishing membrane and the conditioner element, wherein the conditioner element is capable of eroding the polishing membrane.

Advantageously, embodiments of the present invention can compensate for process instability and non-uniformity. Further, the polishing membrane of the embodiments of the present invention can advantageously have a shape and dimensions similar to a conventional table based polishing pad, thus facilitating ease of manufacture using existing or slightly updated manufacturing equipment. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for a membrane based CMP apparatus that utilizes a flexible polishing surface and a pad support capable of manipulating the polishing surface shape to compensate for process instability and non-uniformity. In addition, embodiments of the present invention can utilize a conventional pad shape, thus allowing conventional process consumables to be utilized. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1A:
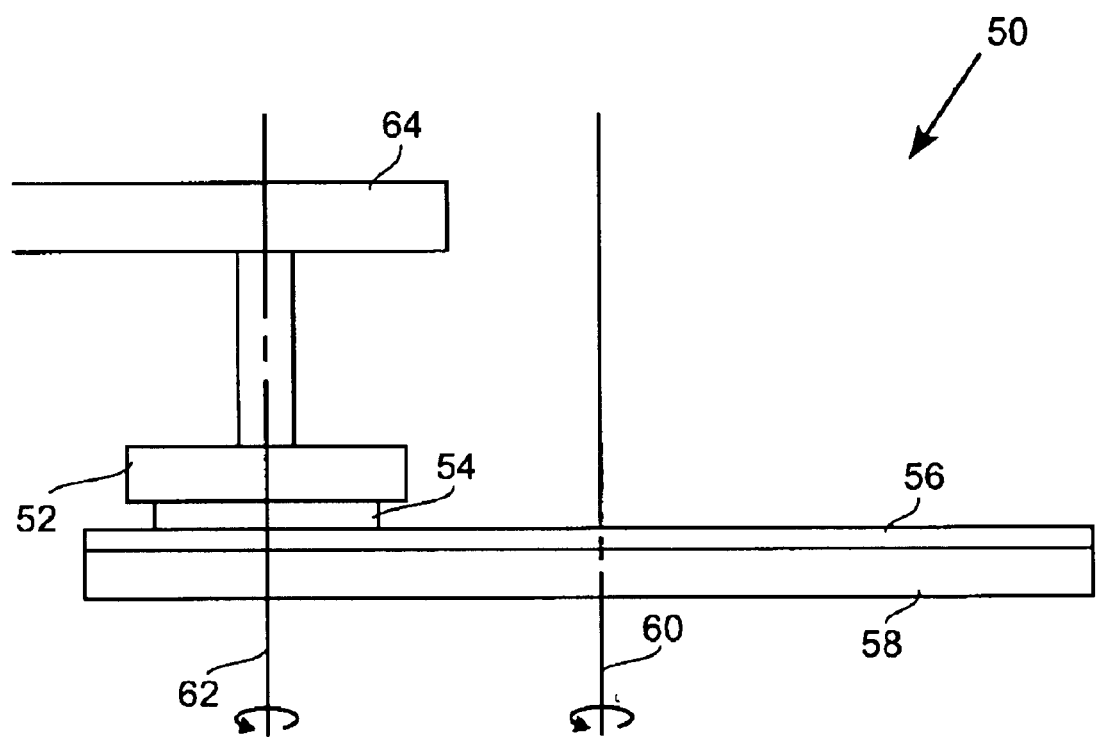
FIG. 1A is a diagram showing a conventional table based CMP apparatus.
Figure 1B:
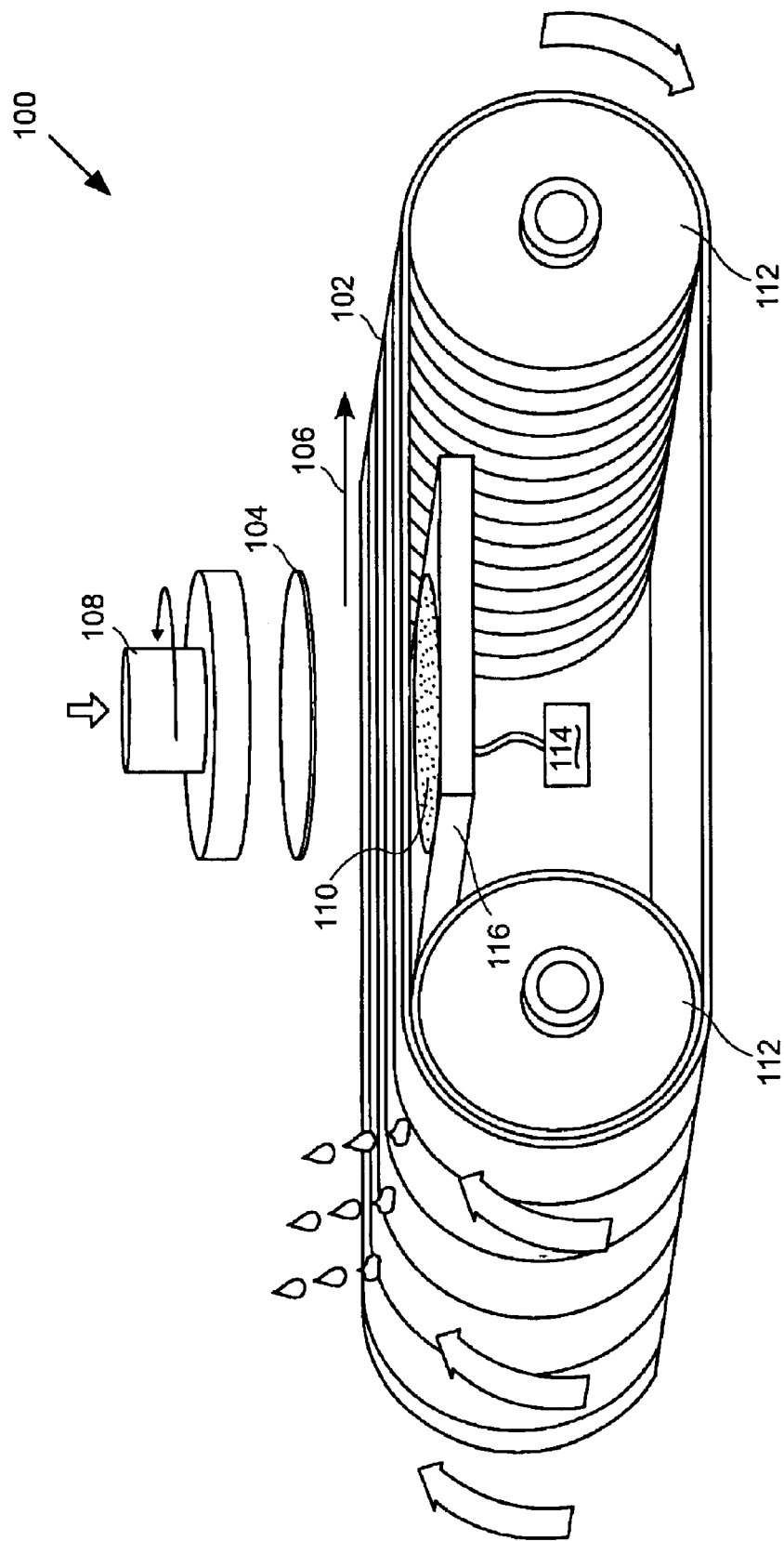
FIG. 1B shows a side view of a conventional linear wafer polishing apparatus.
Figure 2:
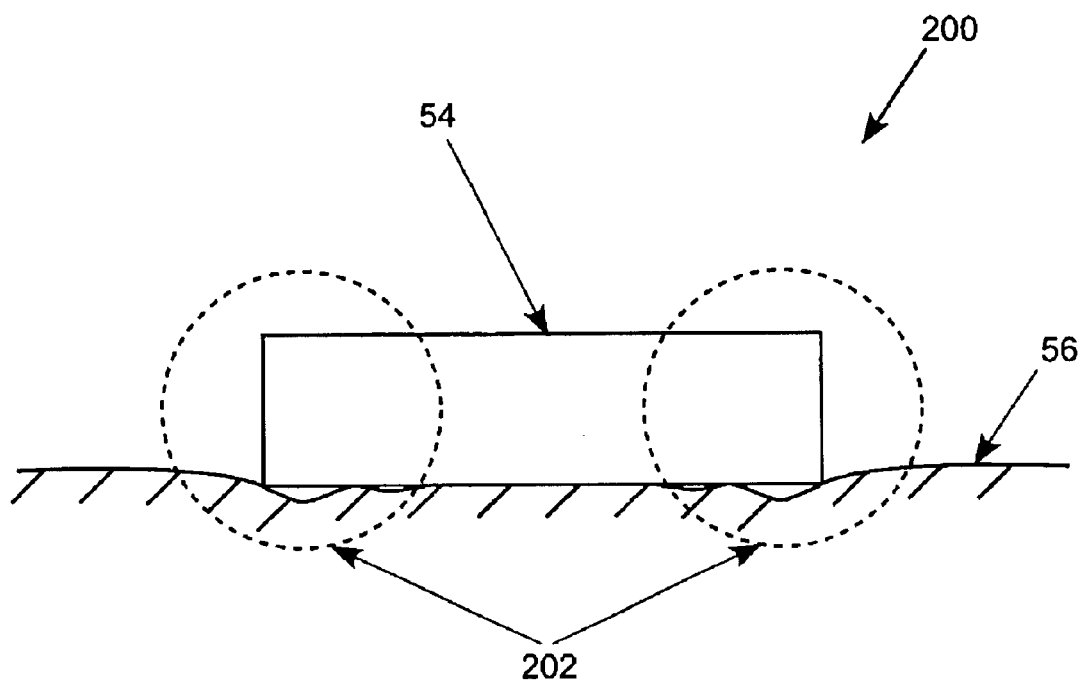
FIG. 2 is a diagram showing a wafer pad interface, illustrating edge effect non-uniformity factors.
Figure 3A:
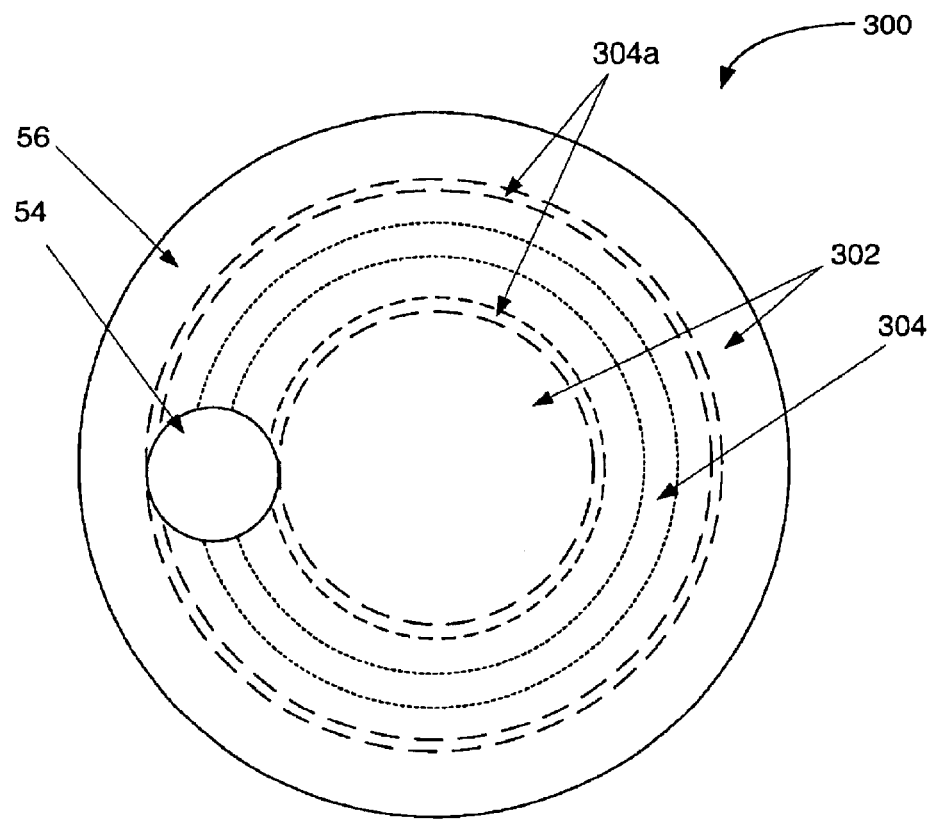
FIG. 3A is a diagram showing a top view of a prior art table based CMP apparatus.
Figure 3B:
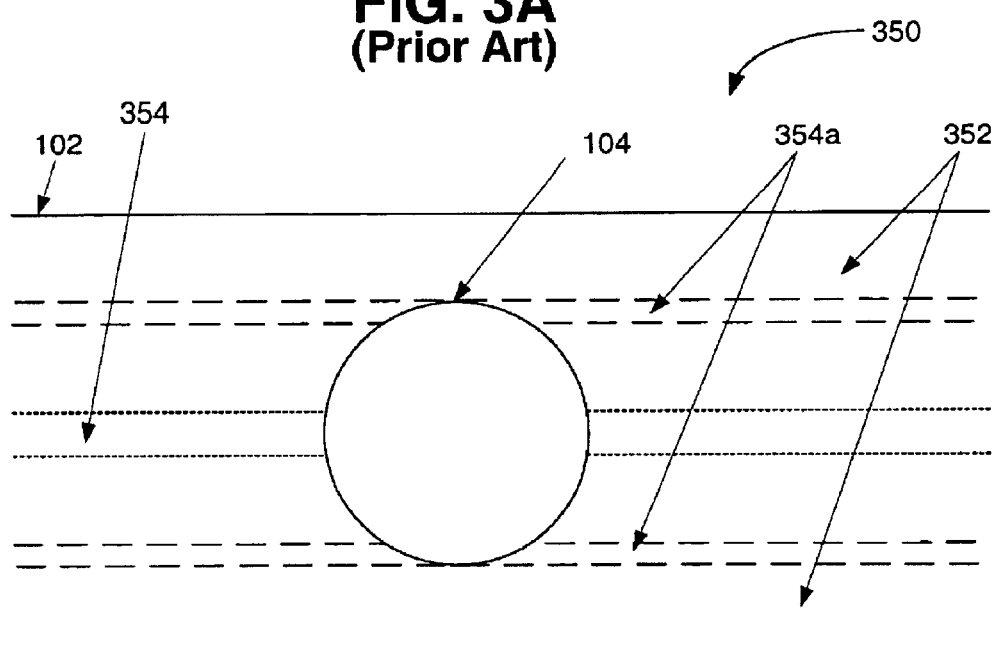
FIG. 3B is a diagram showing a top view of a prior art linear wafer polishing apparatus.
Figure 4:
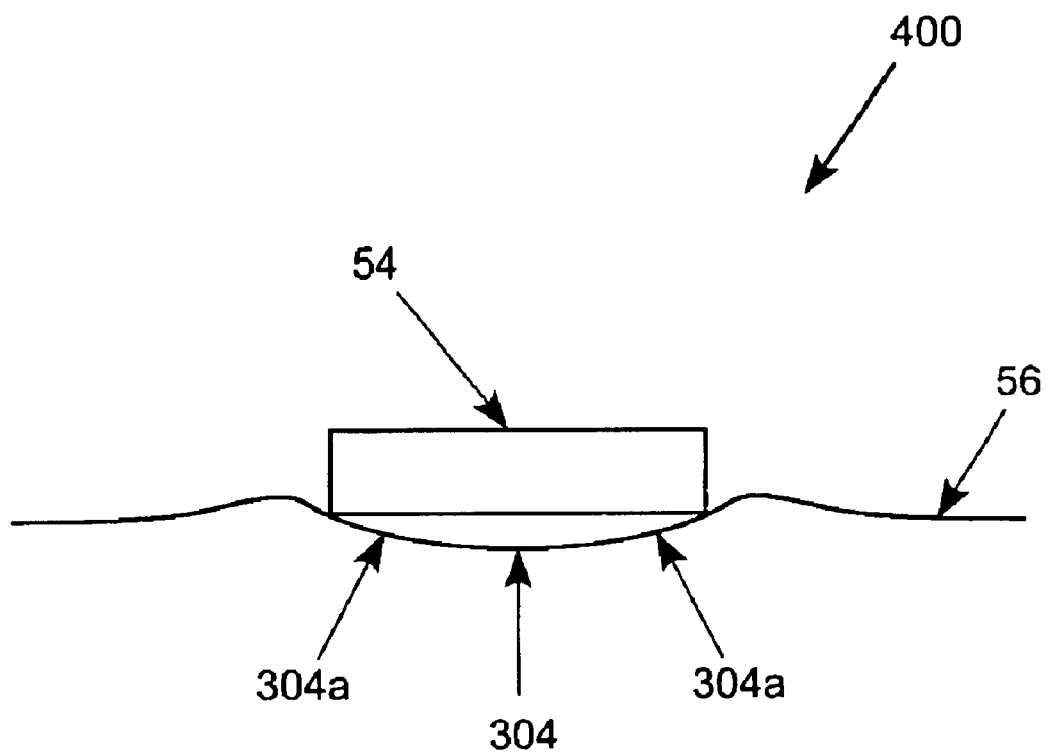
FIG. 4 is a diagram showing a wafer pad interface, illustrating pad erosion instability factors.
Figure 5:
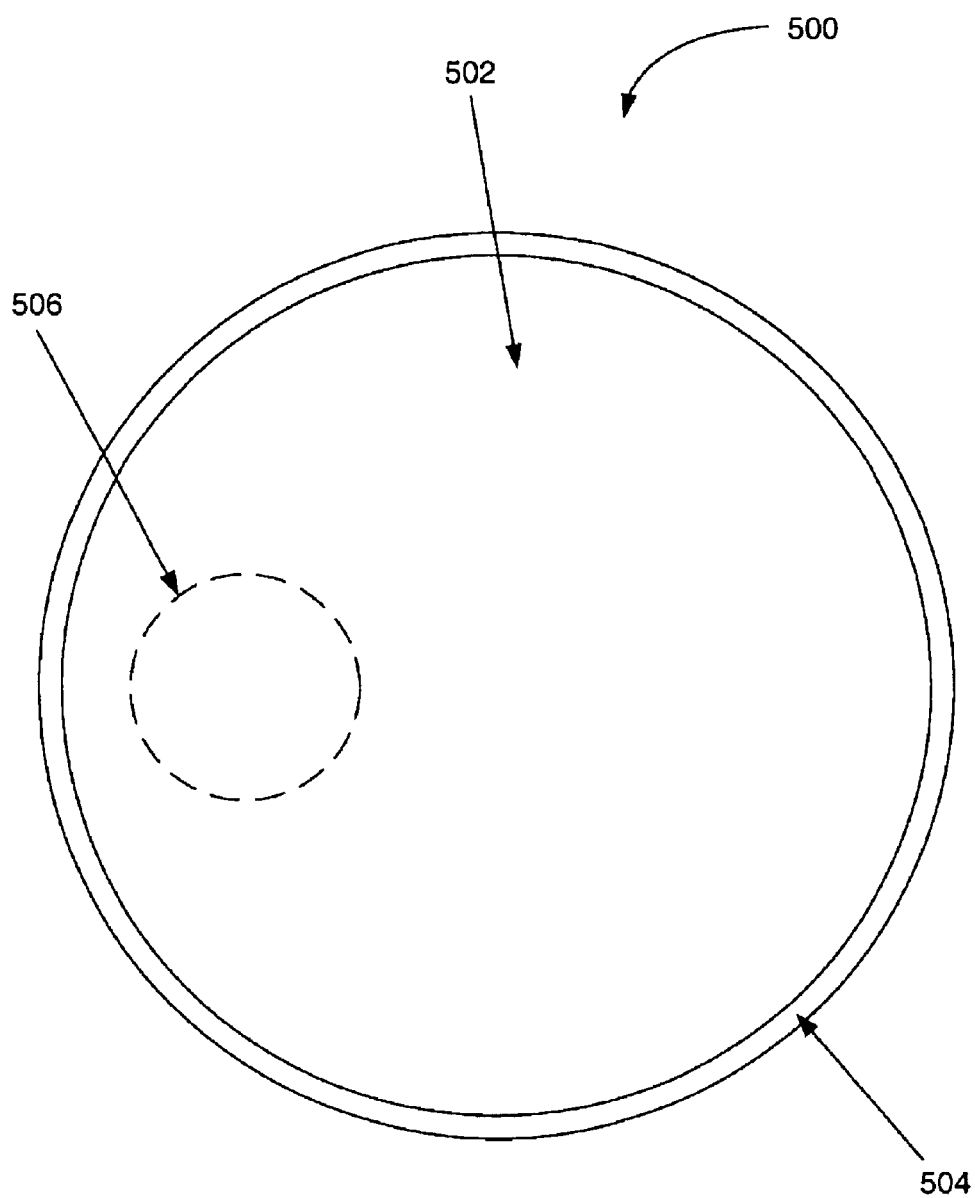
FIG. 5 is a diagram showing a top view of a membrane based CMP apparatus using a flexible polishing membrane in conjunction with an active pad support, in accordance with an embodiment of the present invention.

Embodiments of the present invention utilize a flexible polishing membrane in conjunction with pad support capable of manipulating the polishing surface shape to compensate for process instability and non-uniformity. FIG. 5 is a diagram showing a top view of a membrane based CMP apparatus 500 using a flexible polishing membrane in conjunction with an active pad support, in accordance with an embodiment of the present invention. In one embodiment, the membrane based CMP apparatus 500 includes a two dimensionally stressed polishing membrane 502 stretched over a cylindrical frame and attached via a clamp 504. The polishing membrane 502 of the embodiments of the present invention can comprise an open cell foamed polyurethane, a sheet of polyurethane having a grooved surface, or other material suitable for use as a polishing surface during CMP. As illustrated in FIG. 5, the polishing membrane 502 can advantageously have a shape and dimensions similar to conventional table based polishing pad, thus facilitating ease of manufacture using existing or slightly updated manufacturing equipment. However, it should be borne in mind that a polishing membrane 502 of the embodiments of the present invention can be implemented using any shape, as required by a particular use. Further, although the polishing membrane 502 is shown attached to the frame via a clamp 504, it should be noted that a polishing membrane 502 of the embodiments of the present invention can be attached to the frame using any attachment means, as will be apparent to those skilled in the art.

In use, a wafer can be positioned in a wafer polishing position 506 on the polishing membrane 502. The frame, to which the polishing membrane 502 is attached, is rotated about a central axis causing the polishing membrane 502 to remove surface material from the wafer at wafer polishing position 506. The polishing membrane 502 is used in conjunction with slurry to polish the wafer, For example, the polishing membrane 502 can be wetted with a chemical polishing slurry having both an abrasive and other polishing chemicals. Reactive force is provided by a pad support, which resists the downward force of the wafer applied by a polishing head, and is capable of shaping the polishing membrane 502 in such a manner as to compensate for process instability and non-uniformity, as described in greater detail subsequently.

Figure 6:
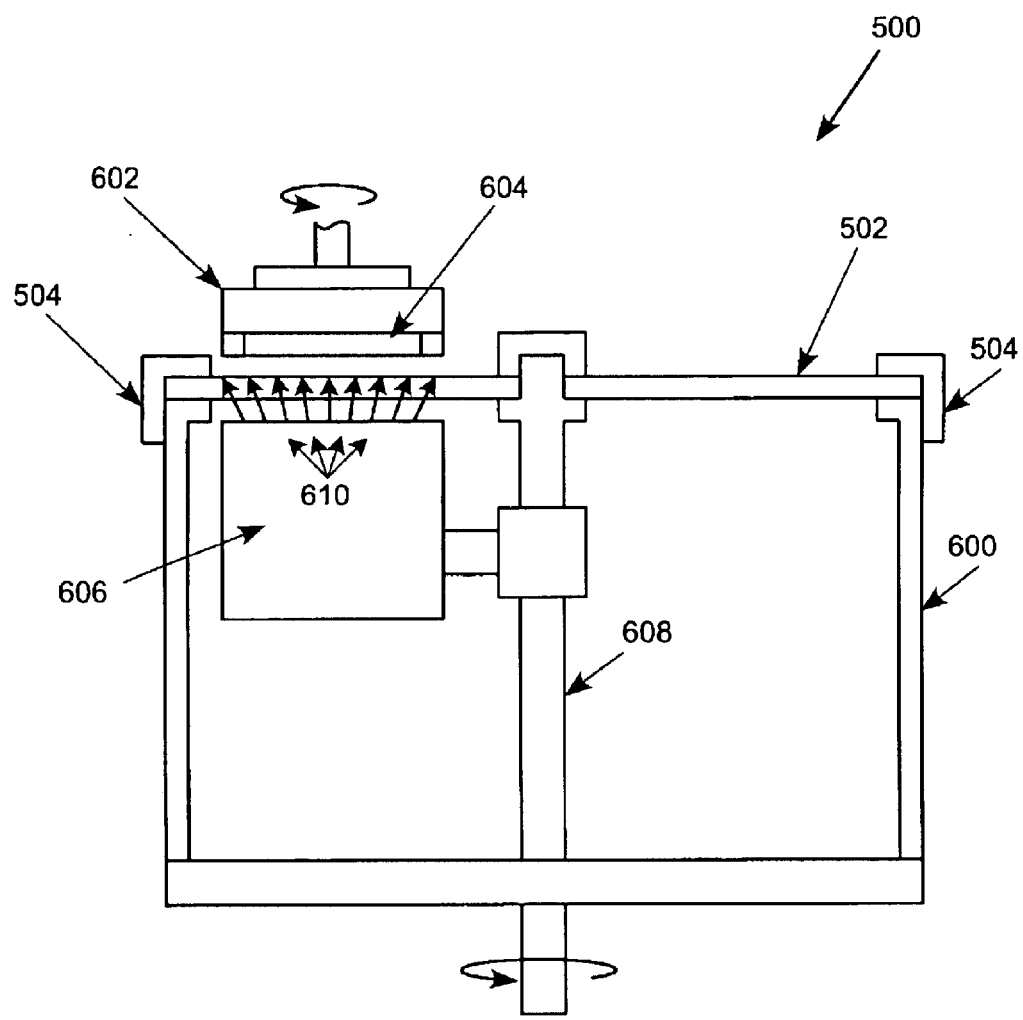
FIG. 6 is a diagram showing a side view of a membrane based CMP apparatus using a flexible polishing membrane in conjunction with an active pad support, in accordance with an embodiment of the present invention.

FIG. 6 is a diagram showing a side view of a membrane based CMP apparatus 500 using a flexible polishing membrane in conjunction with an active pad support, in accordance with an embodiment of the present invention. The membrane based CMP apparatus 500 includes a two dimensionally stressed polishing membrane 502 stretched over a cylindrical frame 600 and attached via a clamp 504. In one embodiment, the polishing membrane 502 is a polishing pad, or a stack comprised of a polishing pad, a subpad, and a supporting thin sheet of metal or other stiff material.

As mentioned above with reference to FIG. 5, the polishing membrane 502 can advantageously have a shape and dimensions similar to conventional table based polishing pad, thus facilitating ease of manufacture using existing or slightly updated manufacturing equipment. Although the polishing membrane 502 is shown attached to the frame via a clamp 504, it should be noted that a polishing membrane 502 of the embodiments of the present invention can be attached to the frame using any means, as will be apparent to those skilled in the art.

Positioned above the polishing membrane 502 is a polishing head 602, which holds a wafer 604. The polishing head 602 applies downward force to the wafer 604, which contacts the polishing membrane 502. Reactive force is provided by a pad support 606 disposed below the polishing membrane 502 and attached to a central shaft 608. The pad support 606 resists the downward force applied by the polishing head 602, and is further capable of shaping the polishing membrane 502 in such a manner as to compensate for process instability and non-uniformity.

In one embodiment, the pad support is an air bearing, which provides upward force on the polishing membrane 502 via a plurality of independently controlled output holes 610 to control the profile of the polishing membrane 502. As explained in greater detail below, the air bearing provides both a reactive force to counteract the downward force of the polishing head 602 when polishing the wafer 604, and a polishing membrane shaping ability, which compensates for process instability and non-uniformity.

Further, embodiments of the present invention can utilize a pad support 606 that is in contact with the polishing membrane 502 to provide upward force on the polishing membrane 502. In this embodiment, upward force is provided via a plurality of independently controlled mechanical elements. The mechanical elements can further differentially flex the polishing membrane 502 to shape the polishing membrane 502 during the CMP process, which compensates for process instability and non-uniformity.

In operation, the frame 600, to which the polishing membrane 502 is attached, is rotated about its central axis, and the polishing head 602 is rotated about its central axis and translated across the polishing membrane 502 surface. The polishing head 602 applies downward force to the wafer 604, which contacts the polishing membrane 502. Reactive force is provided by the polishing pad support 606, such as an air bearing, which resists the downward force applied by the polishing head 602. The polishing membrane 502 is used in conjunction with slurry to polish the wafer 604. As mentioned above, the polishing membrane 502 can comprise an open cell foamed polyurethane or a sheet of polyurethane having a grooved surface, which is wetted with a chemical polishing slurry having both an abrasive and other polishing chemicals.

Figure 7:
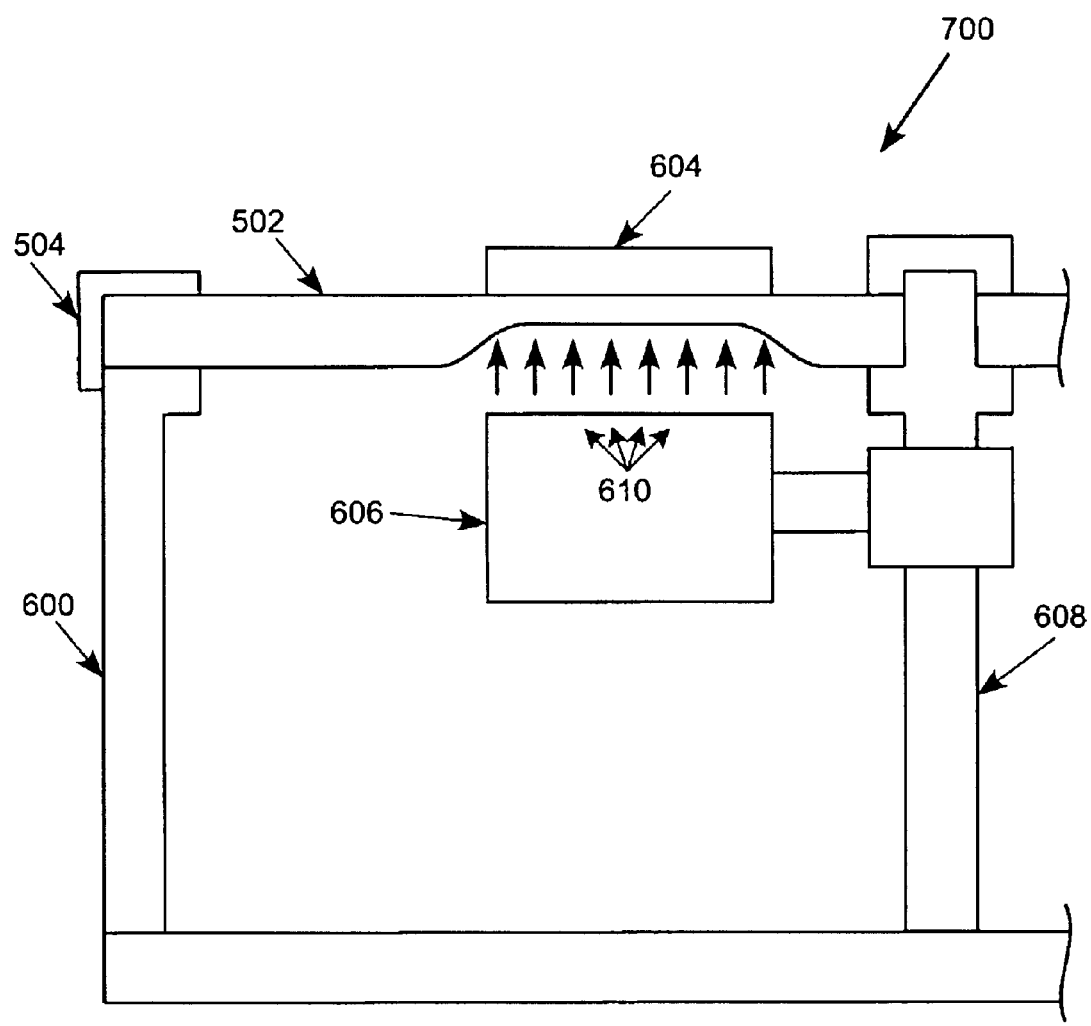
FIG. 7 is a cross-sectional view of a wafer pad interface, in accordance with an embodiment of the present invention.

FIG. 7 is a cross-sectional view of a wafer pad interface 700, in accordance with an embodiment of the present invention. The wafer pad interface 700 shows the wafer 604 in contact with the polishing membrane 502, which is attached to the frame 600 via a clamp 504 or other attaching mechanism. Disposed below the polishing membrane is a pad support 606, such as an air bearing. As mentioned above, an air bearing pad support 606 includes a plurality of independently controlled output holes 610 to control the profile of the polishing membrane 502.

In particular, the air bearing pad support 606 allows a process engineer to compensate for process non-uniformity by blowing air through the independently controlled output holes 610 onto the underside of the polishing membrane 502. The resulting pressure on the polishing membrane 502 provides the reactive force needed to counteract the downward force from the polishing head and wafer 604, thus allowing the wafer to be planarized. In addition, the airflow can be controlled in such a manner as to compensate for edge effects, membrane erosion, and other process instability and non-uniformity factors present. For example, the ability to manipulate the flexible polishing membrane 502 through air pressure allows the polishing membrane 502 to remain in constant contact with the wafer 604, thus compensating for membrane erosion. Further, process instability and non-uniformity can be addressed using a conditioner in conjunction with the pad support, as described next with reference to FIG. 8.

Figure 8:
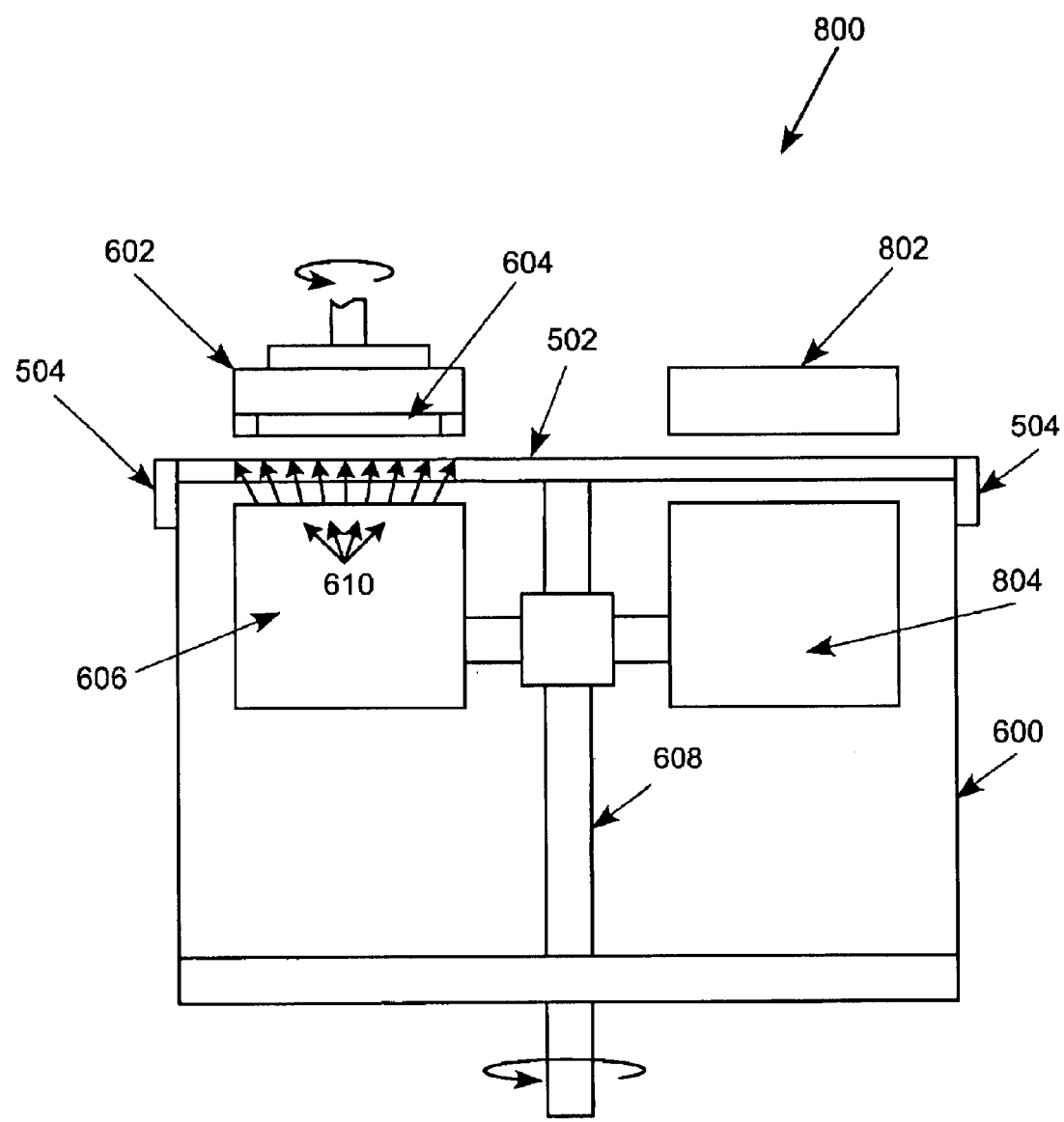
FIG. 8 is a diagram showing a side view of a membrane based CMP apparatus having a conditioner, in accordance with an embodiment of the present invention.

FIG. 8 is a diagram showing a side view of a membrane based CMP apparatus 800 having a conditioner, in accordance with an embodiment of the present invention. The membrane based CMP apparatus 800 includes a two dimensionally stressed polishing membrane 502 stretched over a cylindrical frame 600 and attached via a clamp 504. The polishing membrane 502 can be a polishing pad, or a stack comprised of a polishing pad, a subpad, and a supporting thin sheet of metal or other stiff material.

As mentioned above with reference to FIG. 5, the polishing membrane 502 can advantageously have a shape and dimensions similar to conventional table based polishing pad, thus facilitating ease of manufacture using existing or slightly updated manufacturing equipment. Although the polishing membrane 502 is shown attached to the frame via a clamp 504, it should be noted that a polishing membrane 502 of the embodiments of the present invention can be attached to the frame using any means, as will be apparent to those skilled in the art. Furthermore, although the frame illustrated in FIG. 8 is cylindrical, it should be noted that a frame of the embodiments of the present invention can have any shape desired by the user, for example rectangular, octagonal, elliptical, or any other shape that can be utilized in a CMP process. Further, the frame can actually comprise a plurality of frames, which together form a large frame to which the polishing membrane 502 is attached.

Positioned above the polishing membrane 502 is a polishing head 602, which holds a wafer 604. The polishing head 602 applies downward force to the wafer 604, which contacts the polishing membrane 502. Reactive force is provided by a pad support 606 disposed below the polishing membrane 502 and attached to a central shaft 608. The pad support 606 resists the downward force applied by the polishing head 602, and is capable of shaping the polishing membrane 502 in such a manner as to compensate for process instability and non-uniformity.

The membrane based CMP apparatus 800 further includes a membrane conditioner 802, such as a diamond disk, positioned above a conditioning pad support 804. As with the pad support 606 positioned below the polishing head 602 and wafer 604, the conditioning pad support can be a non-contact pad support such as an air bearing. As mentioned above, an air bearing pad support 804 provides upward force on the polishing membrane 502 via a plurality of independently controlled output holes to control the profile of the polishing membrane 502. The air bearing provides both a reactive force to counteract the downward force of the conditioner 802, and a polishing membrane shaping ability, which compensates for process instability and non-uniformity during conditioning.

As described previously, embodiments of the present invention can further utilize a pad support 606 that is in contact with the polishing membrane 502 to provide upward force on the polishing membrane 502 via a plurality of independently controlled mechanical elements. The mechanical elements can further differentially flex the polishing membrane 502 to shape the polishing membrane 502 during conditioning, which compensates for process instability and non-uniformity.

During conditioning, the conditioner 802 intentionally erodes the polishing membrane 502 in such a manner as to level the surface of the polishing membrane 502. When a wafer 604 undergoes planarization using the polishing membrane 502, material is removed from the polishing membrane 502 in addition to the material removed from the surface of the wafer 604. In particular, material is removed from the polishing membrane 502 in a wafer path that contacts the wafer during the CMP process. The conditioner 802 can compensate for membrane erosion along the wafer path by creating a similar erosion outside the wafer path, thus leveling the surface of the polishing membrane 802.

Figure 9:
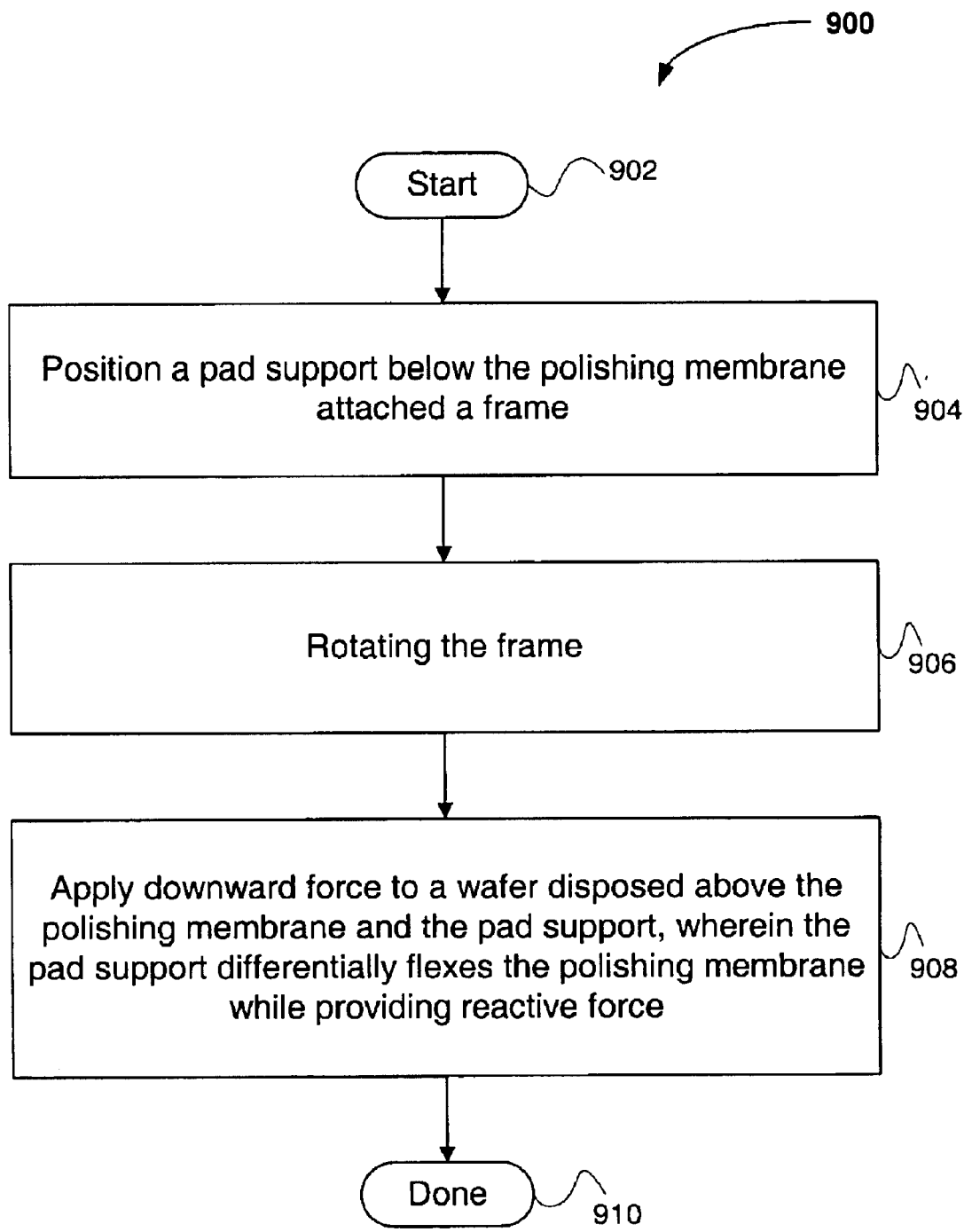
FIG. 9 is a flowchart showing a method for planarizing a wafer surface during a CMP process, in accordance with an embodiment of the present invention.

FIG. 9 is a flowchart showing a method 902 for planarizing a wafer surface during a CMP process, in accordance with an embodiment of the present invention. In an initial operation 902, preprocess operations are performed. Preprocess operations can include applying a patterned mask to the wafer, etching the surface of the wafer, cleaning the wafer, and other preprocess operations that will be apparent to those skilled in the art.

In operation 904, a pad support is positioned below the polishing membrane, which is attached to a frame. As mentioned above, a membrane based CMP apparatus of the embodiments of the present invention includes a two dimensionally stressed polishing membrane stretched over, and attached, to a frame and attached via a clamp. The polishing membrane can be a polishing pad, or a stack comprised of a polishing pad, a subpad, and a supporting thin sheet of metal or other stiff material. The polishing membrane can advantageously have a shape and dimensions similar to conventional table based polishing pad, thus facilitating ease of manufacture using existing or slightly updated manufacturing equipment.

In operation 906, the frame is rotated. The frame, to which the polishing membrane is attached, is rotated about its central axis, and a polishing head, to which the wafer is attached, is rotated about its central axis. Further, the polishing head can be translated across the polishing membrane surface. As mentioned above, it should be noted that the frame can have any shape desired by the user, for example, cylindrical, rectangular, octagonal, elliptical, or any other shape that can be utilized in a CMP process. Further, the frame can actually comprise a plurality of frames, which together form a large frame to which the polishing membrane is attached.

Downward for is applied to the wafer, which is disposed above the polishing membrane and the pad support, in operation 908. The polishing head, which holds a wafer and which applies downward force to the wafer, causes the wafer to contact the polishing membrane. Reactive force is provided by the pad support disposed below the polishing membrane and attached to a central shaft. The pad support resists the downward force applied by the polishing head, and is capable of differentially flexing the polishing membrane in such a manner as to compensate for process instability and non-uniformity.

In one embodiment, the pad support is an air bearing, which provides upward force on the polishing membrane via a plurality of independently controlled output holes to control the profile of the polishing membrane. As mentioned previously, the air bearing provides both a reactive force to counteract the downward force of the polishing head when polishing the wafer, and a polishing membrane shaping ability, which compensates for process instability and non-uniformity. In addition, embodiments of the present invention can utilize a pad support that is in contact with the polishing membrane to provide upward force on the polishing membrane via a plurality of independently controlled mechanical elements. The mechanical elements can differentially flex the polishing membrane to shape the polishing membrane during the CMP process, which compensates for process instability and non-uniformity. Moreover, embodiments of the present invention can utilize a fluid bearing pad support that provides fluid pressure to the polishing membrane via a plurality of independently controlled output holes to control the profile of the polishing membrane. Similar to the air bearing, the fluid bearing provides both a reactive force to counteract the downward force of the polishing head when polishing the wafer, and a polishing membrane shaping ability, which compensates for process instability and non-uniformity.

When using an air bearing as a pad support, the process engineer can compensate for process non-uniformity by blowing air through the independently controlled output holes onto the underside of the polishing membrane. The resulting pressure on the polishing membrane provides the reactive force needed to counteract the downward force from the polishing head and wafer, thus allowing the wafer to be planarized. In addition, the airflow can be controlled in such a manner as to compensate for edge effects, membrane erosion, and other process instability and non-uniformity factors present. For example, the ability to manipulate the flexible polishing membrane through air pressure allows the polishing membrane to remain in constant contact with the wafer, thus compensating for any membrane erosion that occurs during the CMP process.

Post process operations are performed in operation 910. Post process operations can include conditioning the polishing membrane surface, process endpoint detection, and further wafer processing operations that will be apparent to those skilled in the art. In this manner, embodiments of the present invention can compensate for process instability and non-uniformity. Further, the polishing membrane of the embodiments of the present invention can advantageously have a shape and dimensions similar to conventional table based polishing pad, thus facilitating ease of manufacture using existing or slightly updated manufacturing equipment.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for chemical mechanical planarization (CMP), comprising:
    at least one frame;
    a polishing membrane attached to the at least one frame; and
    a pad support disposed below the polishing membrane, the pad support capable of differentially flexing the polishing membrane.

2. An apparatus as recited in claim 1, wherein the at least one frame has an essentially round shape.

3. An apparatus as recited in claim 1, wherein the pad support provides non-contact reactive force to the polishing membrane during a CMP process.

4. An apparatus as recited in claim 3, wherein the pad support is an air bearing that provides air pressure to the polishing membrane.

5. An apparatus as recited in claim 3, wherein the pad support provides fluid pressure to the polishing membrane.

6. An apparatus as recited in claim 1, wherein the pad support is in contact with the polishing membrane.

7. An apparatus as recited in claim 6, wherein the pad support includes mechanical elements capable of differentially flexing the polishing membrane during a CMP process.

8. An apparatus as recited in claim 1, further comprising a conditioner element disposed above the polishing membrane, wherein the conditioner element is capable of eroding the polishing membrane.

9. An apparatus as recited in claim 8, further comprising a conditioner pad support disposed below the polishing membrane and the conditioner element.

10. An apparatus for chemical mechanical planarization (CMP), comprising:
    a cylindrical frame;
    a polishing membrane attached to an end of the cylindrical frame; and
    a pad support disposed within the cylindrical frame and below the polishing membrane, the pad support capable of differentially flexing the polishing membrane.

11. An apparatus as recited in claim 10, wherein the pad support is an air bearing that provides air pressure to the polishing membrane to differentially flex the polishing membrane during a CMP process.

12. An apparatus as recited in claim 10, wherein the pad support is in contact with the polishing membrane, and wherein the pad support includes mechanical elements capable of differentially flexing the polishing membrane during a CMP process.

13. An apparatus as recited in claim 10, further comprising:
    a conditioner element disposed above the polishing membrane; and
    a conditioner pad support disposed below the polishing membrane and the conditioner element, wherein the conditioner element is capable of eroding the polishing membrane.

* * * * *